United States Patent [19]

Beckwith et al.

[11] Patent Number: 4,998,147
[45] Date of Patent: Mar. 5, 1991

[54] FIELD EFFECT ATTENUATOR DEVICES HAVING CONTROLLED ELECTRICAL LENGTHS

[75] Inventors: William B. Beckwith; John M. Golio, both of Chandler, Ariz.

[73] Assignee: Motorola, Inc., Schaumburg, Ill.

[21] Appl. No.: 387,050

[22] Filed: Jul. 31, 1989

[51] Int. Cl.[5] .................. H01L 29/480; H01L 29/560; H01L 29/640
[52] U.S. Cl. .................................. 357/15; 357/51; 357/52
[58] Field of Search .................. 357/22 I, 22 J, 15, 357/51, 52, 23.14; 437/918; 333/81 A, 81 R; 338/306, 307, 314

[56] References Cited

U.S. PATENT DOCUMENTS 3,397,447  8/1968  Currin et al. ................... 29/577

FOREIGN PATENT DOCUMENTS 0051552  3/1983  Japan ................................. 357/15
0105341  6/1984  Japan ................................. 357/15
0223315 11/1985  Japan ............................. 333/81 R
0057254  3/1987  Japan ................................. 357/15

Primary Examiner—Rolf Hille
Assistant Examiner—Peter Toby Brown
Attorney, Agent, or Firm—Maurice J. Jones

[57] ABSTRACT

Overlapping gate electrodes are selectively energized to vary the electrical length and thus the resistance of the conductive path through a field effect attenuator. The electrical width can also be varied to provide additional control over the resistance.

14 Claims, 4 Drawing Sheets

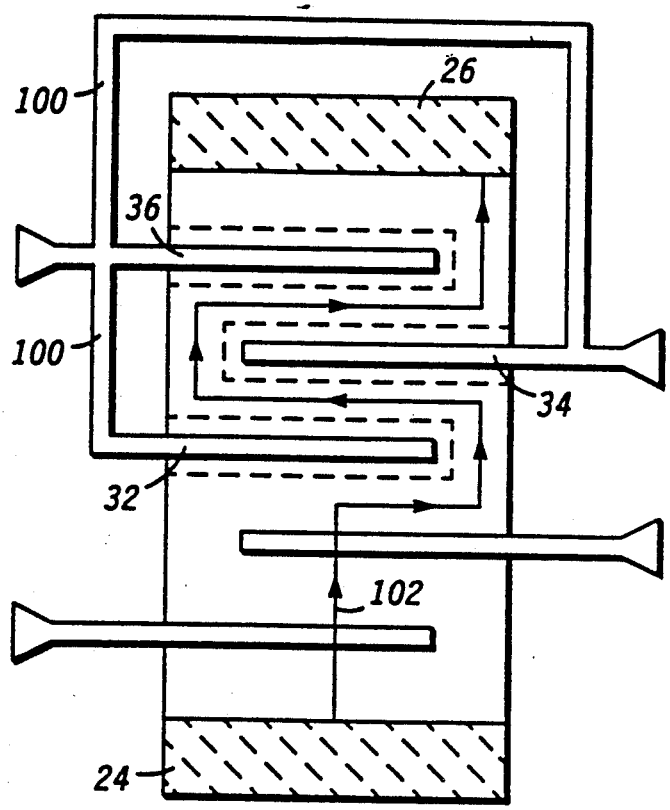
FIG. 5
FIG. 6
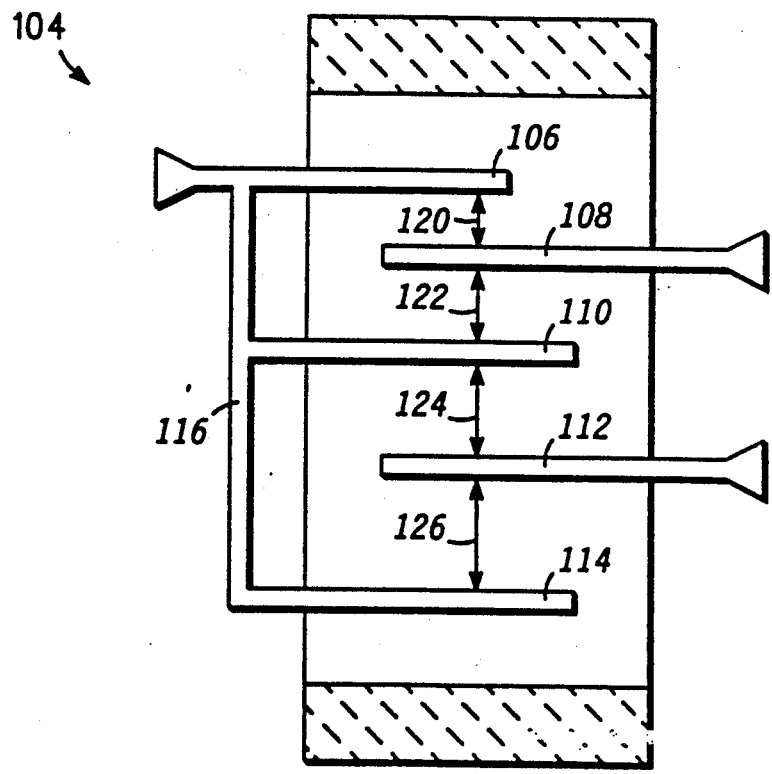

FIELD EFFECT ATTENUATOR DEVICES HAVING CONTROLLED ELECTRICAL LENGTHS

CROSS REFERENCE TO A RELATED PATENT APPLICATION

The subject matter of the present application is related to the subject matter of a patent application entitled "DIGITALLY CONTROLLED FIELD EFFECT ATTENUATOR DEVICES" having a filing date of JUNE 5, 1989, and a Ser. No. of 361,470, and which is assigned to the same assignee as the present application.

BACKGROUND OF THE INVENTION

The subject invention relates generally to attenuator circuitry and particularly to variable attenuator devices employing field effect technology.

Present day electronic applications often require the utilization of attenuator circuits or components which are responsive to control signals to vary the amount of resistance provided thereby. Such attenuators are useful for automatic gain control circuits, position locating systems, telephone systems, television systems, etc.

Prior art, electronically variable solid state attenuators for use at Radio Frequencies (RF) typically employ PIN diodes. PIN diode attenuators may be arranged in a variety of network configurations. Biasing control circuitry which include Field Effect Transistors (FETs) have been utilized to bias the PIN diodes in response to various analog control signal magnitudes, thereby causing the PIN diode network to provide any one of a variety of resistance magnitudes. Discrete PIN diode attenuators are capable of outstanding performance but require an undesirable amount of electrical power for some applications. Moreover, PIN diodes are not easily integrated into monolithic circuitry.

Other prior art approaches for providing electronically variable attenuators sometimes utilize FETs such as gallium arsenide (Ga As) Metal Semiconductor Field Effect Transistors (MESFETs). These devices also may be arranged in a variety of networks and each device may operate without bias and therefore consume almost no electrical power except during switching operations. Analog control signals are applied to the gates of these devices to adjust the attenuation level. The resistance magnitude provided by each FET is adjusted by controlling the depth of the undepleted channel in the device in accordance with the magnitude of the analog signal. Unfortunately, such variation of the depth of the undepleted channel tends to result in a nonlinear transfer characteristic which provides high intermodulation levels between RF signals applied to these devices. This causes the generation of unwanted frequency components that result in distortion.

To minimize such distortion, some prior art attenuators utilize additional circuitry which undesirably increases cost, size, weight and undesirably decreases reliability. Moreover, prior art attenuators sometimes require precise control of the magnitudes of the analog control signals. Such precision is difficult to achieve because analog signal magnitudes tend to drift with temperature, age of the semiconductors, variations of process parameters from device to device, etc. Also, some MESFET attenuator networks tend to have a limited tuning range.

Monolithic Microwave Integrated Circuits (MMIC) applications using GaAs semiconductor material are presently being developed because of the high frequency handling capabilities and the small size of such circuits. These applications require electronically variable attenuators which are compatible with the presently available MMIC semiconductor fabricating processes. The aforementioned prior art attenuators tend to be too expensive to fabricate, take too much space and/or have an unduly high failure rate for some of these applications. Also, some complex prior art attenuators utilizing analog control signals tend to operate too slowly to take advantage of the inherent speed characteristics of MMIC circuitry.

SUMMARY OF THE INVENTION

Accordingly, it is an object of the present invention to provide electronically variable attenuators which are capable of high speed, digitally controlled operation over wide bandwidths.

Another object of the invention is to provide electronically variable attenuators which are compatible with MMIC applications and which can be provided in monolithic integrated circuit form.

An electronically variable field effect attenuator in accordance with an embodiment of the invention includes semiconductor material providing a signal path between an input electrode and an output electrode. Overlapping gate electrodes are arranged to extend across the semiconductor material from different directions. Gate electrode control lines are selectively coupled to the gate electrodes. These control lines are adapted to selectively apply digital control signals in the form of "1's" or "0's" to the gate electrodes to control the conductivity of the semiconductor regions underlying the gate electrodes to thereby control the magnitude of the attenuation provided by the attenuator by changing the length of the conductive path between the input and output electrodes.

BRIEF DESCRIPTION OF THE DRAWING

A more complete understanding of the present invention may be derived by reference to the detailed description and the claims considered along with the accompanying drawings wherein like reference numbers designate similar parts.

FIG. 5 shows a mode of operation of another attenuator configuration having interconnected gate electrodes;

FIG. 6 illustrates an attenuator having unequally spaced gate electrodes; and

DETAILED DESCRIPTION OF THE PREFERRED EMBODIMENTS

Figure 1:
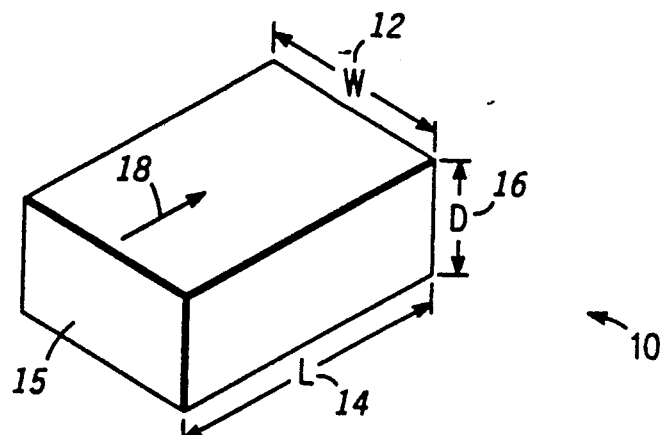
FIG. 1 shows a resistive element.

FIG. 1 shows a resistive semiconductor element 10 having a width 12, a length 14, and a depth 16. Current is assumed to flow in the direction of arrow 18 between front surface 15 and the hidden back surface. The magnitude of the resistance of resistive element 10 is determined by the geometry thereof and the material properties of the active semiconductor material. More specifically, the resistance R can be given to a first order as:

$$R = \frac{(rho) \cdot L}{A} \quad \text{Equation (1)}$$

where (rho) is the bulk resistivity of the active semiconductor material, L is the electrical length of the conductor path and A is the cross-sectional area of the active semiconductor region. In FIG. 1, the cross-sectional area A of element 10 is width 12 times depth 16.

The bulk resistivity of the semiconductor material of element 10 can be estimated to a first order as:

$$(rho) = \frac{L}{q\, u_o\, N} \quad \text{Equation (2)}$$

where q is an electronic charge, $u_o$ is the low-field mobility of the semiconductor material and N is the free carrier density of the semiconductor. If part of the semiconductor material of a resistive element is depleted then the cross-sectional area A of the active semiconductor is the product of the active region depth times the active region width.

Figure 2:
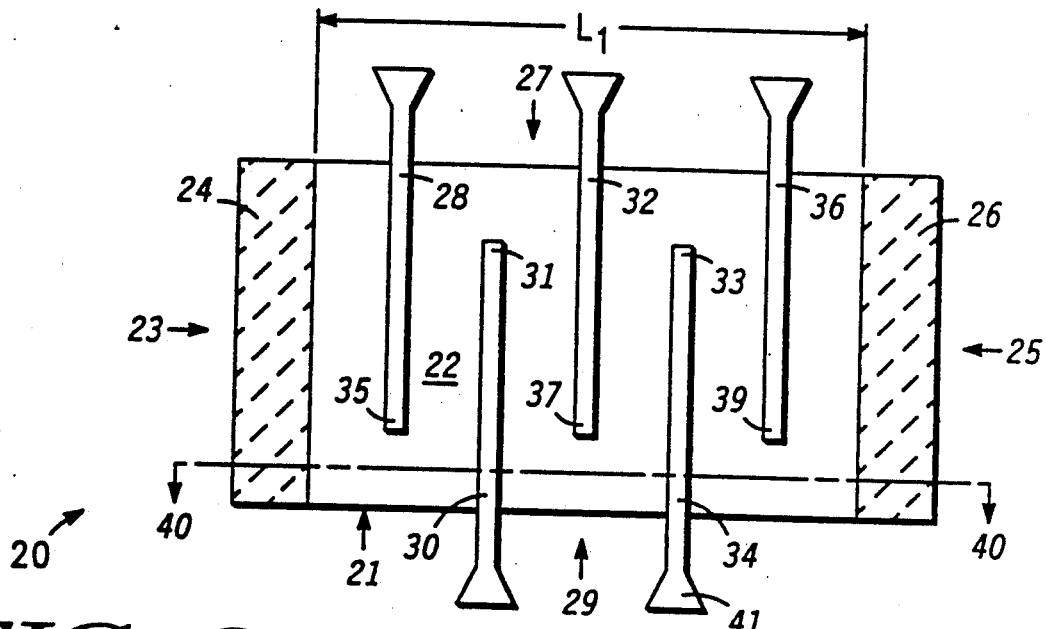
FIG. 2 is a top view of an embodiment of a field effect attenuator.

FIG. 2 shows a top view of the layout of an electronically variable field effect attenuator device 20 in accordance with one embodiment of the invention. Discrete levels of attenuation may be provided by device 20 depending on the arrangement of the digital "1's" and "0's" applied to the gate electrodes thereof. Device 20 may be fabricated using any one of a plurality of different technologies including standard silicon or gallium arsenide (GaAs) fabrication. For many microwave circuit applications, it would be useful to fabricate device 20 using depletion mode gallium arsenide (GaAs) MESFET technology. This technology is compatible with MMIC fabrication approaches.

More specifically, device 20 includes semiconductor material 21 which has a resistance determined generally by the principles explained for element 10. Rectangular top surface 22 of material 21 has first and second parallel ends 23 and 25 and first and second parallel sides 27 and 29. Ohmic input electrode 24 is placed near end 23 of semiconductor surface 22 and output ohmic contact 26 is placed near the other end 25 of semiconductor surface 22. Assuming no interaction with other control mechanisms, semiconductor material 21 would normally provide a current path between electrodes 24 and 26 having a predetermined length L1. Parallel Schottky gate electrodes 28, 30, 32, 34 and 36 are placed on and overlie portions of surface 22. The practical limit to the number of gate electrodes is determined by the particular fabrication technology being utilized. Gate electrodes 28, 32 and 36 form a first plurality or group of gate electrodes extending partially across semiconductor surface 22 from first side 27 in a direction perpendicular to the normal current flow between electrodes 24 and 26. Gate electrodes 30 and 34 form a second group or plurality of gate electrodes extending partially across semiconductor surface 22 from second side 29. Gate electrodes 30 and 34 are interdigitated with electrodes 28, 32 and 36. Ends 31 and 33 of electrodes 30 and 34 are closer to side 27 than ends 35, 37 and 39 of electrodes 28, 32 and 36. The electrodes from each group overlap each other as shown in FIG. 2.

Figure 3:
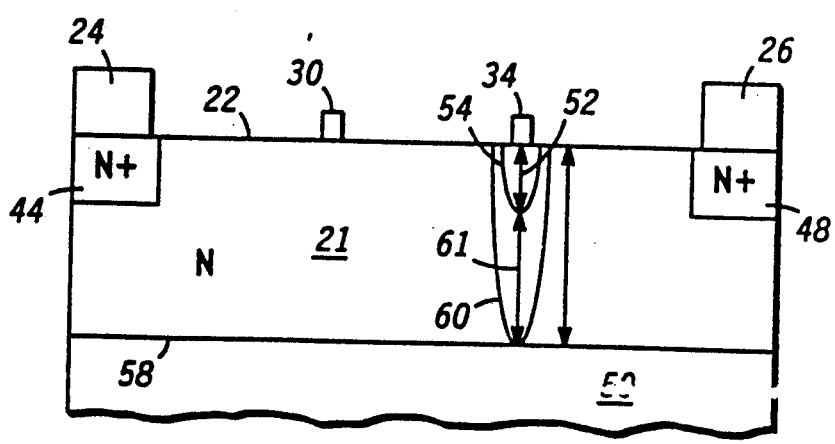
FIG. 3 is a cross-sectional view of the field effect attenuator of FIG. 1.

FIG. 3 indicates a cross section of device 20 along lines 40 of FIG. 2. More specifically, ohmic contacts 24 and 26 are located on surface 22 of the semiconductor material 21 of resistive element 20. Active N channel semiconductor layer 21 supports ohmic contacts 24 and 26 and the rectifying Schottky gate electrodes including contacts 30 and 34. The Schottky rectifying junction formed by the gate electrodes with semiconductor 21 can be provided in a known manner by utilizing gate electrodes made from a proper combination of metals such as tungsten, gold and titanium. N+ regions 44 and 48 are respectively provided underneath electrodes 24 and 26 by known processes.

Gate electrode 34, for instance, includes the portion of the conductor overlying surface 22. The remainder 41 of the conductor can be considered to be a gate control line. Semiconductor material 21 is located on semi-insulating substrate 50. The mere placement of Schottky gate electrodes on semiconductor material 21 results in some depletion of the region of semiconductor material 21 immediately beneath each contact of available free charges. The depletion region 54 for contact 34 extends a distance 52, as shown in FIG. 3. This action takes place because of the difference in the electron affinity of the Schottky metal 34 and semiconductor 21 at the barrier surface 22. The resulting depletion regions automatically exist under zero bias potential conditions. These depletion regions do not effect the electrical length, L1 of the conductive path between electrodes 24 and 26 but these regions do effect the depth of the conductive path.

The depths of the depletion regions can be further varied by varying the magnitude of a potential applied to the gate electrodes such as electrode 34, for instance. More specifically, a negative potential of sufficient magnitude applied to gate electrode 34 will cause the depletion region to extend by distance 61 down to the top surface 58 of semi-insulating substrate material 50 to form depletion region 60 which renders a portion of semiconductor material 21 non-conductive. The potential necessary to cause this occurrence is defined as the pinch off voltage ($V_p$). When pinched off, the resulting depletion in carriers causes a very high resistance region bounded by a line 60 in semiconductor material 21 between ohmic contacts 24 and 26 thereby rendering a portion of device 20 mostly non-conductive.

Alternatively, a more positive potential applied to contact 34, for instance, decreases the depth 52 of zero bias depletion region 54 thereby increasing the conductivity of the portion of the current path underlying gate electrode 34 between ohmic contacts 24 and 26, thereby rendering at least a portion of the device 20 more conductive. A similar description is also applicable to the operation of the other gate electrodes and underlying semiconductor material.

The pinch off voltage of the material is a function of the doping density of the semiconductor material and the depth of the active region. For GaAs MESFET technology, the voltage level, $V_p$, can be expressed approximately as:

$$V_p = -\frac{q\, N\, D^2}{2(eps)} + V_{bi} \quad \text{Equation (3)}$$

where D is the active semiconductor region depth, (eps) is the dielectric constant of the material and $V_{bi}$ is the built-in potential of the rectifying contact which is typically about 0.8 volts.

For normal operating conditions, each of the gate electrodes will be biased at one of two voltage levels at a particular instant in time. One of these voltages levels corresponds to a digital "1". When the gate electrode receives this bias level, the underlying semiconductor material can be in the "on-state". Current can then flow in the semiconductor material beneath the rectifying electrode. For depletion mode Gallium Arsenide MESFET technology commonly used for MMIC circuits, this digital "1" voltage is preferably 0volts. The other voltage level corresponds to a digital "0". If a gate electrode is at this bias level, the underlying semiconductor materials in the "off-state" and current cannot flow underneath the electrode. For depletion mode GaAs MESFET technology, this digital "0" voltage is equal to or more negative than the pinch off voltage, Vp.

Figure 4:
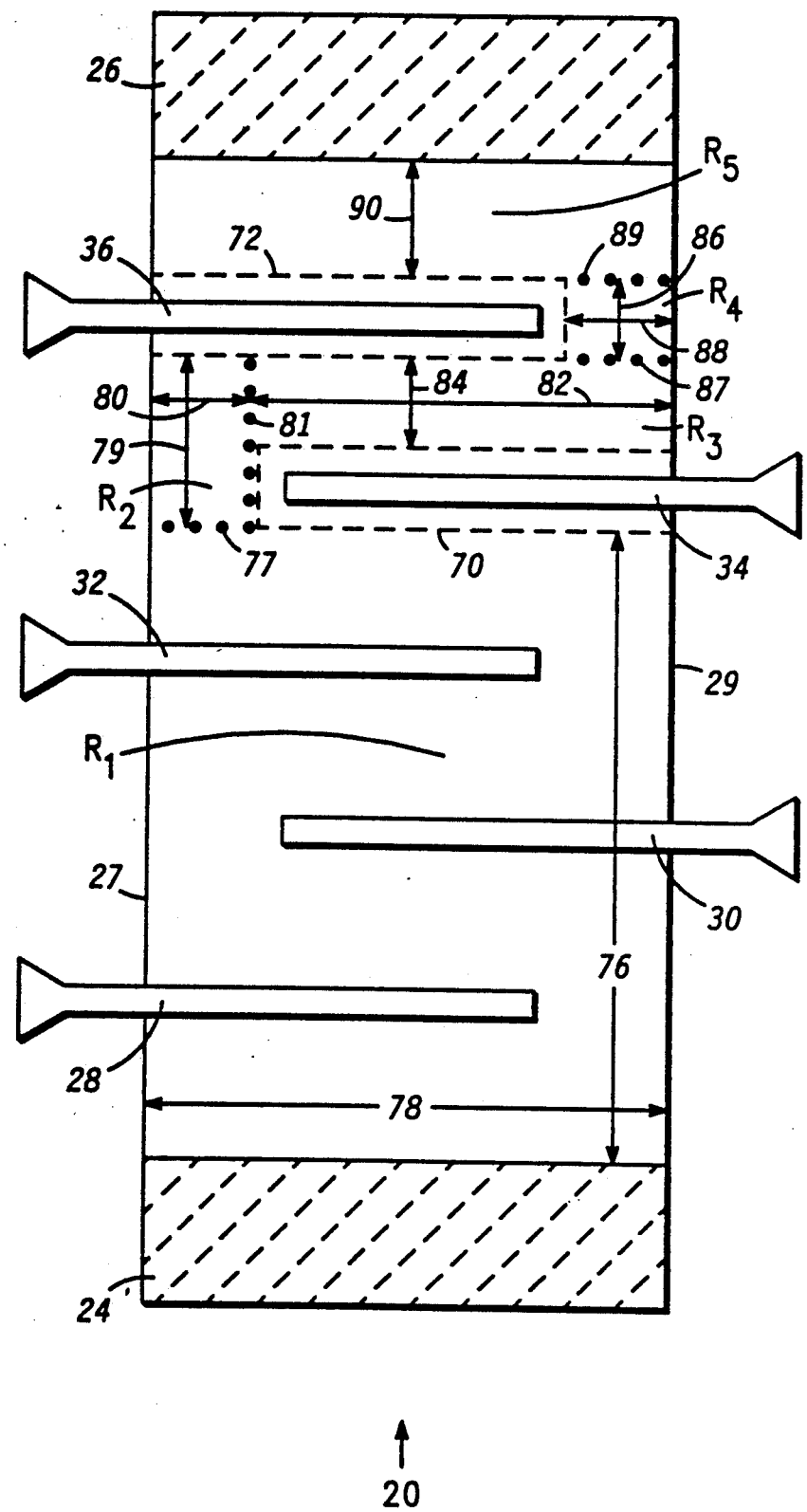
FIGS. 4 illustrates one mode of operation for the attenuator of FIG. 2.

Referring now to FIG. 4, one mode of operation of attenuator 20 will be explained. It is assumed that gate electrodes 34 and 36 are simultaneously receiving the digital "0" voltage which causes their respective depletion regions to have an approximate top shape as outlined by dashed lines 70 and 72. These regions also extend down to substrate 50, as previously explained. It is further assumed that the other gate electrodes 28, 30 and 32 are receiving the digital "1" control signals. Under these conditions the current flowing between electrodes 24 and 26 can be considered to encounter a plurality of differently valued series resistors which combine to provide a composite resistance. The electrical length of the first resistor, R1 is measured by line 76 and the width thereof is measured by line 78. Second resistor, R2 is joined to R1 at dotted line 77. The length of R2 is measured by line 79 and the width of R2 is measured by line 80 between dotted line 81 and side 27. The length of the third resistor, R3 is measured by line 82 between dotted line 81 and side 29, and the width of R3 is measured by line 84. The length of the next resistor, R4 is measured by line 86 between dotted lines 87 and 89, and the width is measured by line 88. The length of the final resistor, R5 is measured by line 90 and the width is again measured by line 78. The total resistance between electrodes 24 and 26, therefore, is equal to the sum of R1+R2+R3+R4+R5. Thus, by controlling the logic signal applied to the gate electrodes to be either a 0 or a 1, the effective electrical lengths encountered by the current flow between electrodes 24 and 26 can be tailored to provide different desired amounts of total resistance. The resistance of composite resistors can be calculated to a first order by using Equation (1).

Also, various gate electrodes can be connected together as indicated in FIG. 5 which shows a gate control line 100 interconnecting electrodes 32, 34 and 36 so that the portions of the semiconductor material underlying these electrodes are rendered simultaneously conductive or nonconductive. If a digital "0" is applied by control line 100 to electrodes 36, 32 and 34, the current generally follows the path indicated by line 102 of FIG. 5. Since path 102 is longer than the straight line path between conductors 24 and 26, path 102 results in increased PTB resistance.

FIG. 6 illustrates a top view of variable attenuator device 104 having gate electrodes 106, 108, 110, 112 and 114. Gate control line 116 interconnects gate electrodes 106, 110 and 114. The distances between these parallel gate electrodes varies. More specifically, the smallest distance is measured between electrodes 106 and 108 by line 120. The distance between electrodes 108 and 110 is greater as indicated by line 122 and the distance between electrodes 110 and 112 is still greater as measured by line 124. Finally, the distance between electrodes 112 and 114 has the greatest magnitude as indicated by line 126. Moreover, gate electrode 106 extends across less of the width of the semiconductor material than the other gate electrodes. The length of the gate electrodes can be adjusted to tailor the attenuation characteristic of the attenuators by varying the width of the conductive path around the electrode when the electrode receives a "0" to meet particular criteria.

Figure 7:
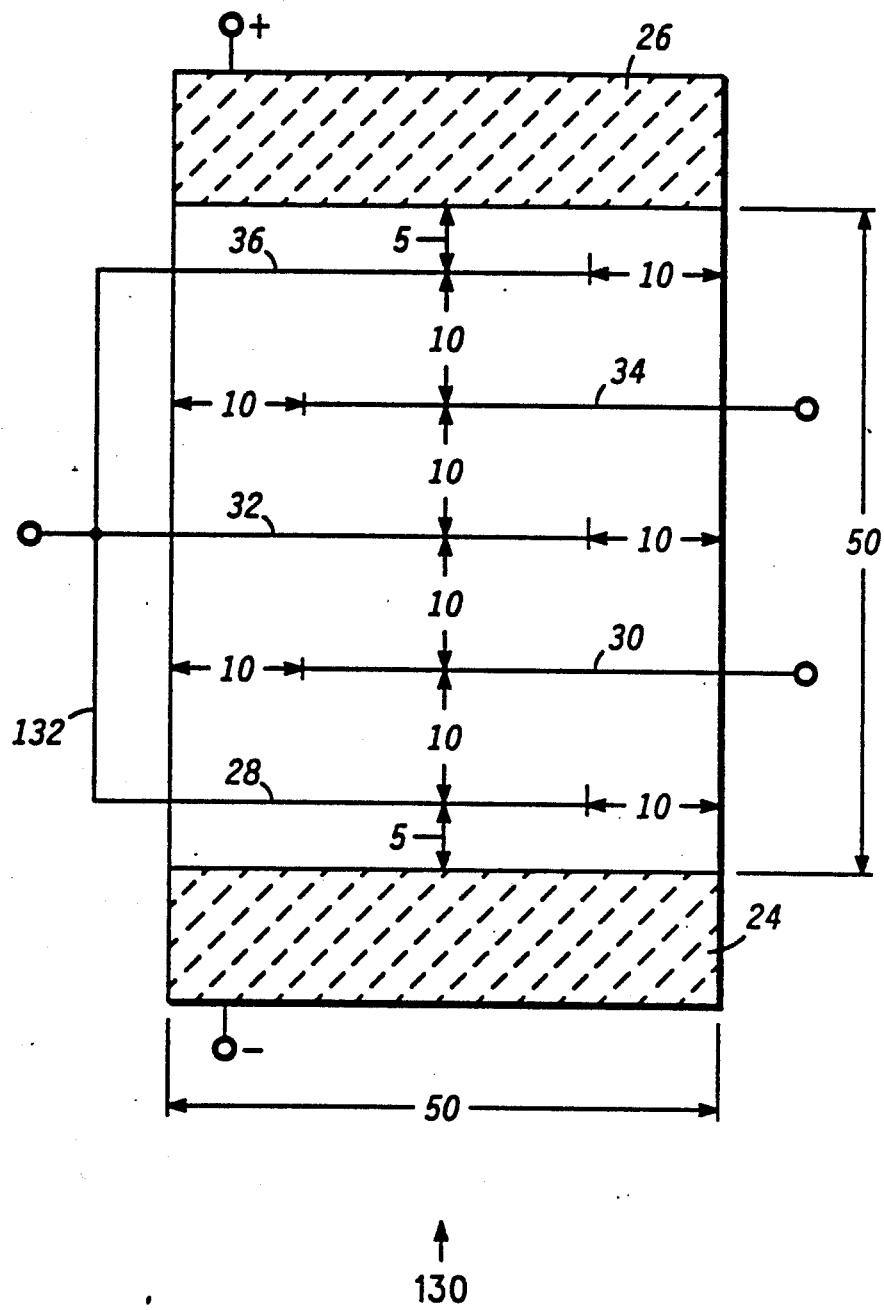
FIG. 7 illustrates a dimensioned attenuator.

FIG. 7 shows dimensions for, attenuator 130 which is similar to attenuator 20 of FIG. 4 except that the gate electrodes 28, 32 and 36 are interconnected by line 132. The resistance between input and output electrodes 24 and 26 corresponding to the indicated digital control signals, is provided by the following table:

| LOGIC STATE (1 = 0 volts, 0 = −Vp) rho = 50 ohms/square | | | |
|---|---|---|---|
| (28,32,26) | 34 | 30 | Rtotal (ohms) |
| 1 | 1 | 1 | 50 |
| 0 | 1 | 1 | 250 |
| 0 | 0 | 1 | 537 |
| 0 | 1 | 0 | 537 |
| 0 | 0 | 0 | 824 |
| 1 | 0 | 0 | 250 (approx.) |

Since the channel portions underlying the gate electrodes of the described attenuators 20, 104 and 130 can be either completely pinched off or conductive, these devices then provide less intermodulation distortion than other types of attenuators utilizing FETs which are operated in partially pinched-off modes. Thus, attenuators 20, 104 and 132 do not require distortion compensation circuitry. Furthermore, the geometries of these attenuators are arranged to have a minimum of parasitic capacitance thereby facilitating the high speed operation for which GaAs MMIC circuits are well suited.

Digital control of attenuators 20, 104 and 130 eliminates the aforementioned problems associated with analog control. Also, these attenuators are capable of wideband operation and can be readily provided in monolithic form required by MMIC applications, for example.

While the invention has been particularly shown and described with reference to the preferred embodiments, those skilled in the art will understand that changes in form and detail may occur therein without departing from the scope of the present invention.

We claim:

1. A variable attenuator providing unequal predetermined magnitudes of attenuation in response to different control signals, the attenuator including in combination:
    an input electrode;
    an output electrode;
    semiconductor material being coupled between said input and output electrodes, said semiconductor material normally providing a first continuous straight-line current path having a first direction between said input and output electrodes, said first current path having a predetermined electrical length;
    a first gate electrode extending along an axis partially across said semiconductor material in a second direction which is perpendicular to said first direction, a first portion of said semiconductor material thereby underlying said first gate electrode;

a second gate electrode extending partially across said semiconductor material along another axis in a third direction which is also perpendicular to said first direction, said second gate electrode thereby being parallel to said first gate electrode, a second portion of said semiconductor material thereby underlying said second gate electrode;

portions of said first and second parallel gate electrodes overlapping each other; and gate control lines for energizing said first and second gate electrodes in response to the control signals to change the conductivity of at least one of said first and second portions of semiconductor material to selectively change the electrical length of the current path between said input and output electrodes of the attenuator to be unequal to said predetermined electrical length, said gate electrodes and said first and second portions of semiconductor material thereby being operative to control the amount of attenuation provided between said input and output electrodes.

2. The variable attenuator of claim 1 wherein:

each of said gate electrodes has an end;

said semiconductor material has a surface with first and second ends and first and second sides, said first and second ends being respectively coupled to said input and output electrodes;

said first gate electrode extending from said first side;

said second gate electrode extending from said second side; and said end of said first gate electrode being located closer to said second side than said end of said second gate electrode so that said first and second gate electrodes overlap.

3. The variable attenuator of claim 1 including a first further gate electrode running across said semiconductor material parallel to said first gate electrode.

4. The variable attenuator of claim 1 including a second further gate electrode running across said semiconductor material parallel to said second gate electrode.

5. The variable attenuator of claim 1 wherein the electrical width of the current path between said input and output electrodes also changes when the electrical length between said input and output electrodes is changed.

6. The variable attenuator of claim 1 wherein said control signals are digital control signals.

7. A variable field effect attenuator providing unequal predetermined magnitudes of attenuation in response to different digital control signals, the field effect attenuator device including in combination:

an input electrode;

an output electrode;

semiconductor material having a surface with first and second parallel ends and first and second parallel sides, said first and second ends being respectively coupled to said input and output electrodes, said semiconductor material providing a first current path between said input and output electrodes in a first direction, said current path having a predetermined electrical length;

a first plurality of gate electrodes each extending partially across said semiconductor surface from said first side of said semiconductor surface in a direction which is perpendicular to said first direction;

at least a second gate electrode extending partially across said semiconductor surface from said second side of said semiconductor surface in a direction which is perpendicular to said first direction, said second gate electrode being interdigitated with said first plurality of gate electrodes;

portions of said first plurality of gate electrodes overlapping with a portion of said second gate electrode; and gate control lines for rendering at least one of said gate electrodes from said first plurality of gate electrodes and said second gate electrode simultaneously conductive in response to the digital signals to selectively change the electrical length of the current path between said input and output electrodes to be unequal to said predetermined electrical length thereby controlling the amount of attenuation provided between said input and output electrodes to provide one of the predetermined magnitudes of attenuation.

8. The variable field effect attenuator of claim 7 wherein said first plurality of gate electrodes run parallel to each other with equal spacing therebetween.

9. The variable field effect attenuator of claim 7 wherein said first plurality of gate electrodes run parallel to each other with unequal spacing therebetween.

10. The variable field effect attenuator of claim 7 wherein at least one of said gate electrodes forms a Schottky connection with the portions of the semiconductor material underlying said at least one of said gate electrodes.

11. The variable field effect attenuator of claim 7 wherein at least one of said gate electrodes has a length which is unequal to the lengths of said other gate electrodes.

12. The variable field effect attenuator of claim 7 being provided in an integrated circuit including gallium arsenide semiconductor material.

13. The variable field effect attenuator of claim 7 wherein the electrical width of the current path between said input and output electrodes also changes when the electrical length between said input and output electrode changes.

14. The variable field effect attenuator of claim 7 further including:

a second plurality of gate electrode extending partially across said semiconductor surface from said second side; and said second plurality of gate electrodes being interdigitated with said first plurality of gate electrodes.

* * * * *